United States Patent
Wang

(10) Patent No.: US 6,207,507 B1
(45) Date of Patent: Mar. 27, 2001

(54) MULTI-LEVEL FLASH MEMORY USING TRIPLE WELL PROCESS AND METHOD OF MAKING

(75) Inventor: Ling-Sung Wang, Hsinchu (TW)

(73) Assignee: Taiwan Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/427,438

(22) Filed: Oct. 26, 1999

Related U.S. Application Data

(62) Division of application No. 09/050,741, filed on Mar. 30, 1998, now Pat. No. 6,091,101.

(51) Int. Cl.[7] .................................................. H01L 21/336
(52) U.S. Cl. .................... 438/267; 438/257; 438/258; 438/261; 438/593; 438/595; 438/596
(58) Field of Search .................................. 438/257, 267, 438/595, 596, 593, 258, 261; 257/315, 316, 318

(56) References Cited

U.S. PATENT DOCUMENTS

| | | | | |
|---|---|---|---|---|
| 5,284,784 | * | 2/1994 | Manley | 437/43 |
| 5,379,255 | * | 1/1995 | Shah | 365/185 |
| 5,478,767 | * | 12/1995 | Hong | 437/43 |
| 5,614,747 | * | 3/1997 | Ahn et al. | 257/316 |
| 5,747,370 | * | 5/1998 | Lee | 438/267 |
| 5,760,435 | * | 6/1998 | Pan | 257/314 |
| 6,117,731 | * | 9/2000 | Wu | 438/260 |

* cited by examiner

*Primary Examiner*—Eddie C. Lee
*Assistant Examiner*—N. Drew Richards
(74) *Attorney, Agent, or Firm*—Blakely Sokoloff Taylor & Zafman, LLP

(57) ABSTRACT

A multi-level flash memory cell formed in a semiconductor substrate. The memory cell comprises: (a) a deep n-well formed in said semiconductor substrate; (b) a p-well formed within said deep n-well; (c) a first insulating layer formed over said p-well; (d) three floating gates adjacent to and insulated from one another and lying atop said first insulating layer; (e) source and drain regions formed in said p-well and on either side of said three floating gates; (f) a second insulating layer atop said three floating gates and said drain and source regions; and (g) a control gate formed atop said second insulating layer.

4 Claims, 3 Drawing Sheets

US 6,207,507 B1

MULTI-LEVEL FLASH MEMORY USING TRIPLE WELL PROCESS AND METHOD OF MAKING

This application is a divisional of Ser. No. 09/050741 on Mar. 30, 1998, now U.S. Pat. No. 6,091,101 issued Jul. 18, 2000.

FIELD OF THE INVENTION

This invention relates to semiconductor flash memory, and more particularly, to a multi-level flash memory using a triple well process.

BACKGROUND OF THE INVENTION

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero". Multi-level flash memory can store two bits per memory cell.

Multi-level flash memory is becoming more popular because of its advantages. In particular, multi-level flash memory lowers the cost per bit for non-volatile memory storage. Further, multi-level flash memory also allows for higher density memories because each memory cell can store two or more bits of data.

Prior art multi-level flash memory has suffered from the problem of difficulty in controlling the data level in the memory cell. Complex electrical circuits are needed to control the program and erase data level of these prior art memory cells. The most difficult aspect is that the data level will shift after cycling tests. What is needed is a multi-level flash memory cell design that is easily written to and read from and is easy to manufacture.

SUMMARY OF THE INVENTION

The present invention provides a new memory cell structure that is easily programmable. A multi-level flash memory cell formed in a semiconductor substrate is disclosed. The memory cell comprises: (a) a deep n-well formed in said semiconductor substrate; (b) a p-well formed within said deep n-well; (c) a first insulating layer formed over said p-well; (d) three floating gates adjacent to and insulated from one another and lying atop said first insulating layer; (e) source and drain regions formed in said p-well and on either side of said three floating gates; (f) a second insulating layer atop said three floating gates and said drain and source regions; and (g) a control gate formed atop said second insulating layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
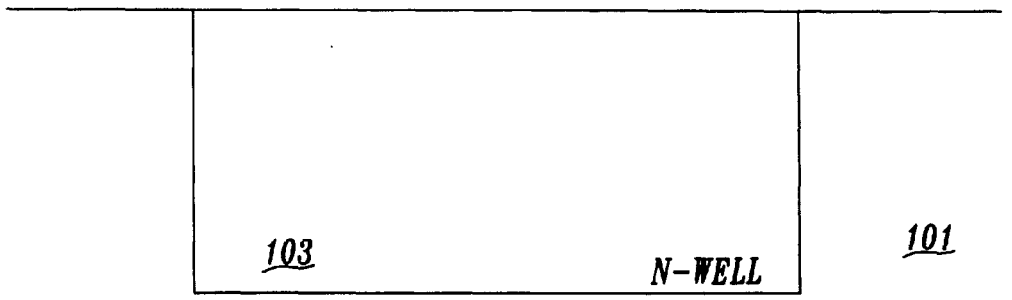
FIGS. 1–6 are cross-sectional views of a semiconductor substrate illustrating the steps in forming a multi-level flash memory cell in accordance with the present invention.

Turning to FIG. 1, a p-type silicon substrate 101 is provided. Within the silicon substrate 101, a deep n-well 103 is formed using conventional masking and high energy ion implantation techniques. In particular, a photoresist mask is formed on the surface of the silicon substrate 101. Next, an ion implantation step is performed by implanting n-type (for example phosphorous) impurities into the silicon substrate. It is preferred that the depth of the deep n-well is 2–3 microns into the surface of the silicon substrate 101. An ion implant energy of 2–3 Mev is sufficient to form this deep n-well 103.

Figure 2:
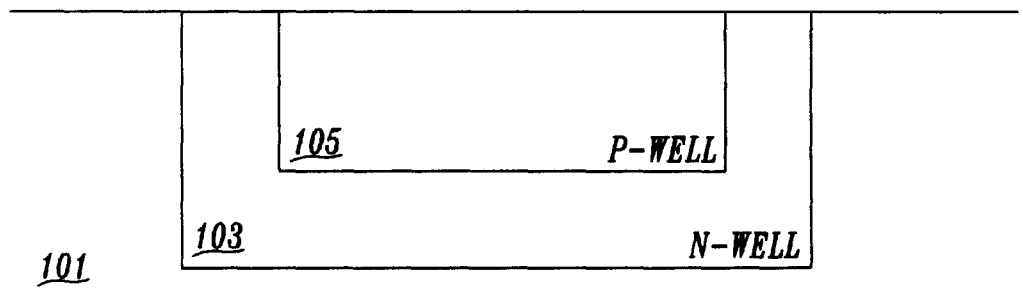

Next, turning to FIG. 2, a p-well 105 is formed within the deep n-well 103. Note that the p-well 105 is completely contained within the deep n-well 103. It is preferred that the depth of the p-well 105 be approximately 1–2 microns into the surface of the silicon substrate 101. An ion implant energy of 250–400 Kev is sufficient to form the p-well 105.

Figure 3:
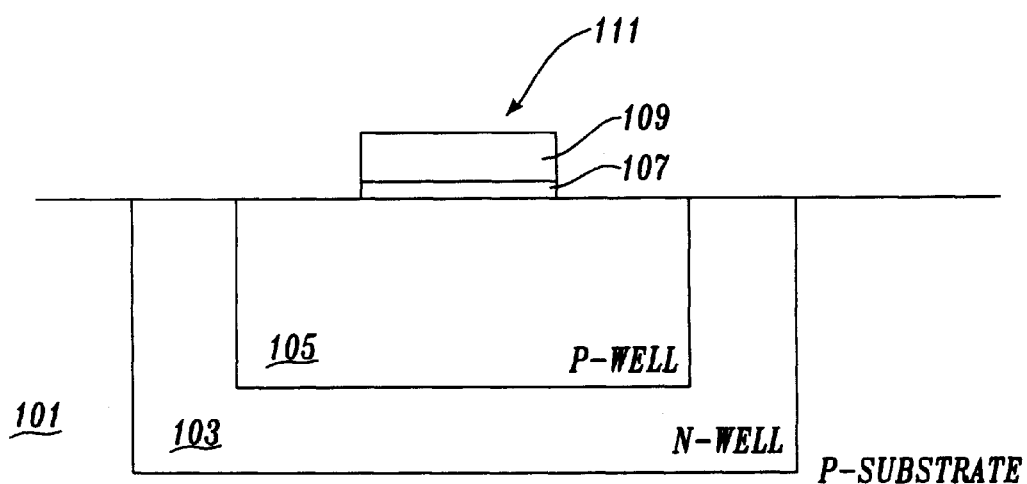

Next, turning to FIG. 3, a thin gate oxide 107 is grown on the silicon substrate 101. Preferable, the gate oxide 107 (when the gate oxide is silicon dioxide) is thermally grown in an oxygen ambient to a thickness of approximately 80–100 angstroms. Alternatively, the gate oxide 107 may be formed using a LPCVD technique. Next, a first polysilicon layer 109 is deposited over the gate oxide 107. The first polysilicon layer 109 is preferably in-situ doped polysilicon. The layer of gate oxide 107 and first polysilicon layer 109 is then patterned and etched to provide an intermediate structure 111 shown in FIG. 3. Further, the preferred length of the intermediate structure 111 is approximately 0.35 microns. By keeping the length of the intermediate structure 111 at a relatively long 0.35 microns, the "punch through" phenomena is suppressed.

Figure 4:
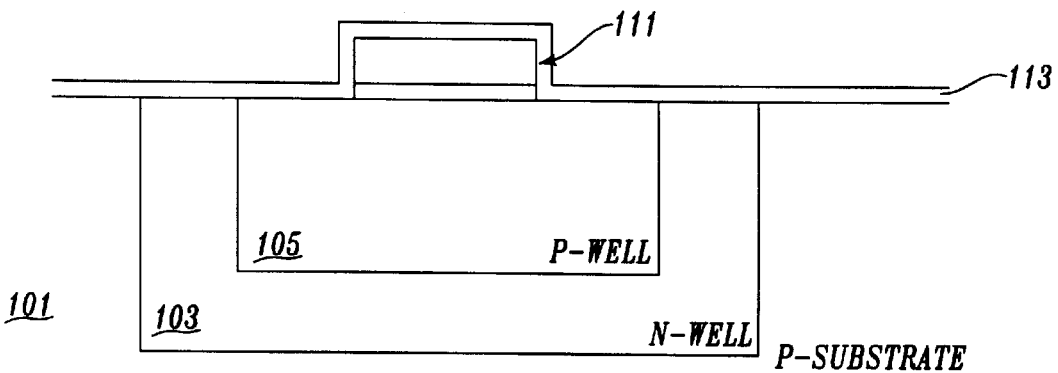

Next, turning to FIG. 4, an insulating dielectric 113 is conformally formed over the intermediate structure 111 and the silicon substrate 101. Preferably, the insulating dielectric 113 is a triple layer of oxide/nitride/oxide, also referred to as ONO. The ONO dielectric layer is a well known composite layer and any suitable technique for its deposit may be used. In the preferred embodiment, ONO is used because of its superior insulation properties which leads to improved data retention. In the preferred embodiment, the ONO composite layer is formed from 60 angstroms of high temperature CVD oxide, 100 angstroms of silicon nitride, and 60 angstroms of high temperature CVD oxide.

Figure 5:
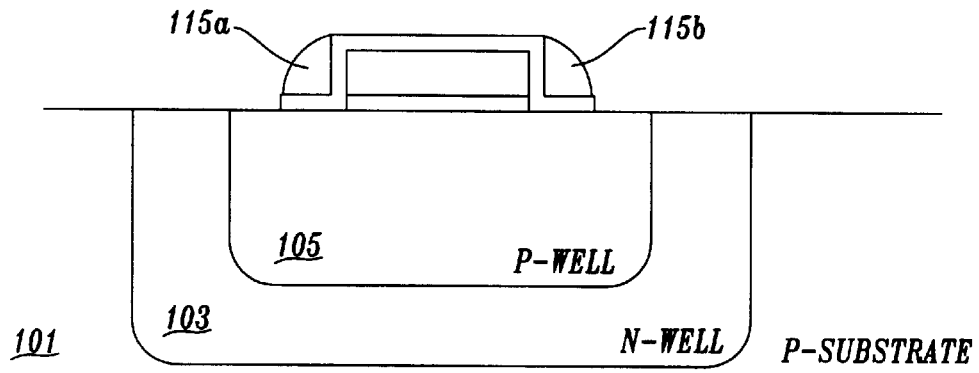

Next, turning to FIG. 5, a second polysilicon layer of approximately 0.15 micron thickness in-situ doped polysilicon is deposited over the entire silicon substrate. The second polysilicon layer is then etched back to form polysilicon sidewall spacers 115a and 115b. Further, the portion of the ONO oxide layer 113 outside of the polysilicon sidewall spacers 115a and 115b is removed using conventional techniques. As is known in the art, by changing the height of the intermediate structure, the width of the polysilicon sidewall spacers 115a and 115b may be controlled. In the preferred embodiment, the height of the first polysilicon layer is 0.15 microns. With this height, the width of the polysilicon sidewall spacers 115a and 115b is on the order of 0.12 microns.

Figure 6:
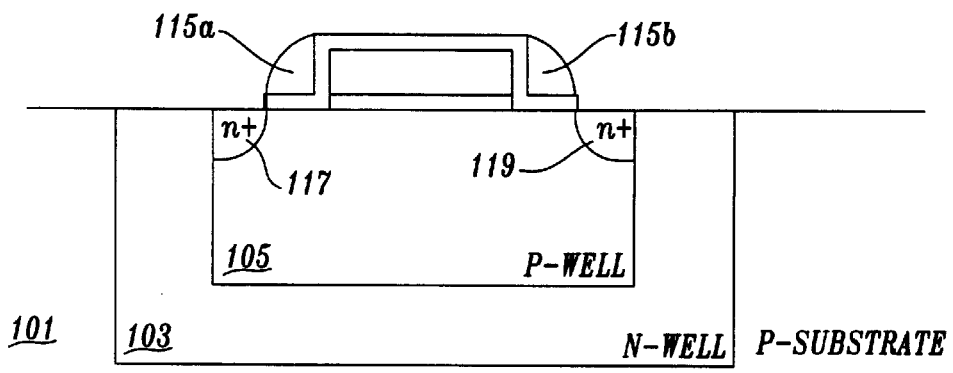

Next, turning to FIG. 6, source region 117 and drain region 119 are formed adjacent the polysilicon sidewall spacers 115a and 115b. The source region 117 and drain region 119 are $n^+$ and are a depth of 1000–2000 angstroms into the p-well 105. An ion implant energy of 50 Kev is used to form the source and drain regions. Then ion implantation may be performed using the photoresist and the polysilicon sidewall spacers as a self aligned source-drain mask.

Figure 7:
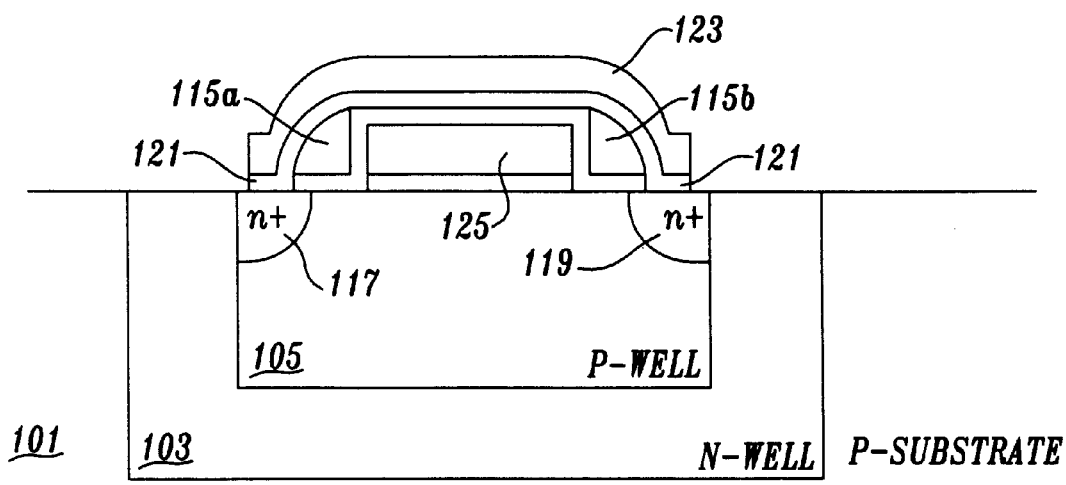
FIG. 7 is a schematic diagram of a multi-level flash memory cell formed in accordance with the present invention.

Next, turning to FIG. 7, an polysilicon oxidation step is performed to repair damage to the polysilicon sidewall spacers during the source/drain ion implantation process. The oxidation step also serves to form an isolating dielectric layer 121 around the polysilicon sidewall spacers 115a and 115b. As will be seen below, the isolating dielectric layer 121 isolates the control gate 123 from the underlying structure. This is conventionally accomplished by heating the entire substrate in an oxygen ambient. During this thermal processing, the source region 117 and drain region 119 will laterally diffuse under the polysilicon sidewall spacers 115a and 115b.

Alternatively, a second ONO composite layer may be deposited onto the entire surface. The second ONO composite layer serves as the isolating dielectric layer 121. The choice of the ONO composite layer adds manufacturing complexity, but at the benefit of providing improved isolation and resultant data integrity. In any event, during the formation of the ONO composite layer, the thermal processing steps result in the source and drain regions laterally diffusing underneath the polysilicon sidewall spacers.

Next, a third polysilicon layer is deposited on the entire structure. The third polysilicon layer will be formed into a control gate 123. Finally, the third polysilicon layer and the second composite ONO layer are patterned and etched to provide the final structure of the multi-level flash memory cell shown in FIG. 7.

As can be seen, the two polysilicon sidewall spacers 115a and 115b constitute two floating gates. The remaining portion of the first polysilicon layer forms the third floating gate 125. Dielectric isolation surrounds all three floating gates. While ONO composite layer dielectric isolation is preferred, any isolating dielectric oxide may be used. The third polysilicon layer forms the control gate 123 that overlays the entire source, drain, and floating gate structure.

In operation, the flash memory cell can be said to store a two-bit binary signal as follows:

| Data | Floating Gate 1<br>Poly Spacer 115b | Floating Gate 2<br>Poly Spacer 115a | Floating Gate 3<br>Poly 125 |
| --- | --- | --- | --- |
| 00 | No Charge | No Charge | No Charge |
| 01 | Stored Charge | No Charge | No Charge |
| 10 | Stored Charge | Stored Charge | No Charge |
| 11 | Stored Charge | Stored Charge | Stored Charge |

Thus, when all of the floating gates 115a, 115b, and 125 do not contain any stored charge, the data stored in the memory cell is considered 00. When stored charge is found only in floating gate one (sidewall spacer 115b), then the data stored is considered 01. When stored charge is found in floating gate 1 (sidewall spacer 115b) and floating gate 2 (sidewall spacer 115a), then the data signal stored is considered 10. Finally, when all floating gates hold stored charge, the data signal stored is considered 11.

In order to program charge onto the various floating gates, the following voltages are applied to the control gate 123, the source 117, the drain 119, the p-well 105, and the deep n-well 103. For programming charge into the floating gate 1 (sidewall spacer 115b), a voltage of 9 volts is applied to the control gate 123, a voltage of 5 volts is applied to the drain 119, and the source 117, p-well 105, and the deep n-well 103 is held at ground. The mechanism used to program charge is channel high-injection into the floating gate 1.

For programming charge into the floating gate 2 (sidewall spacer 115a), a voltage of 9 volts is applied to the control gate 125, a voltage of 5 volts is applied to the source 117, and the drain 119, p-well 105, and the deep n-well 103 is held at ground. The mechanism used to program charge is channel high-injection into the floating gate 2.

For programming charge into the floating gate 3 (poly 125), a voltage of 9 volts is applied to the control gate 125, a voltage of −5 volts is applied to the p-well 105, and the drain 119, source 117, and the deep n-well 103 is held at ground. The mechanism used to program charge is Fowler-Nordheim tunneling into the floating gate 3.

In order to erase all of floating gates, a voltage of −10 volts is applied to the control gate 125, a voltage of 5 volts is applied to the p-well 105 and the deep n-well 103, and the drain 119 and source 117 are floating.

Finally, the read operation of the flash memory cell is performed by applying a voltage of 5 volts to the control gate 125, applying a voltage of 1.5 volts to the drain 119, and holding the source 117, p-well 105, and deep n-well 103 at ground. The application of the 1.5 volts to the drain will prevent the phenomena of "slow drain programming."

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of manufacturing a multi-level flash memory cell a semiconductor substrate, said method comprising the steps of:

(a) forming a deep n-well in said semiconductor substrate;

(b) forming a p-well within said deep n-well;

(c) forming a gate oxide layer on semiconductor substrate;

(d) forming a first polysilicon layer over said gate oxide layer;

(e) patterning and etching said first polysilicon layer and said gate oxide layer to form an intermediate structure within the width of said p-well;

(f) forming a first dielectric layer over said intermediate structure;

(g) depositing a second polysilicon layer over said first dielectric layer;

(h) etching back said second polysilicon layer to form two polysilicon sidewall spacers adjacent said intermediate structure;

(i) forming source and drain regions adjacent said polysilicon sidewall spacers;

(j) forming a second dielectric layer over said semiconductor substrate;

(k) forming a third polysilicon layer over said second dielectric layer; and (l) patterning and etching said third polysilicon layer and said second dielectric layer to form a control gate that is insulated from and extends at least over and between said two polysilicon sidewall spacers.

2. The method of claim 1 wherein said first dielectric layer is ONO.

3. The method of claim 1 wherein said second dielectric layer is ONO.

4. The method of claim 2 wherein said second dielectric layer is ONO.

* * * * *